Nov. 3, 1964 L. E. ST. JEAN 3,155,881
HIGH FREQUENCY TRANSMISSION LINE
Filed Feb. 28, 1961 2 Sheets-Sheet 1
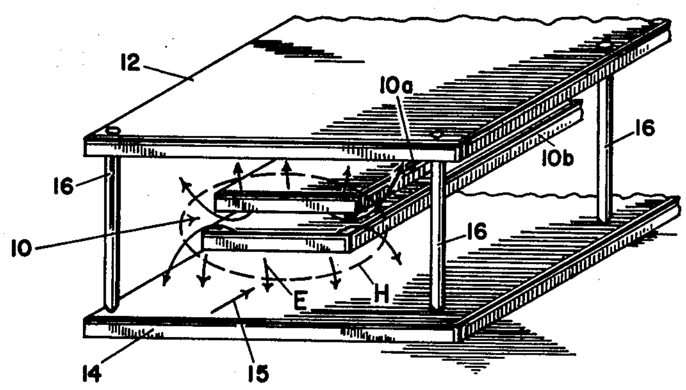
PRIOR ART Fig. 1
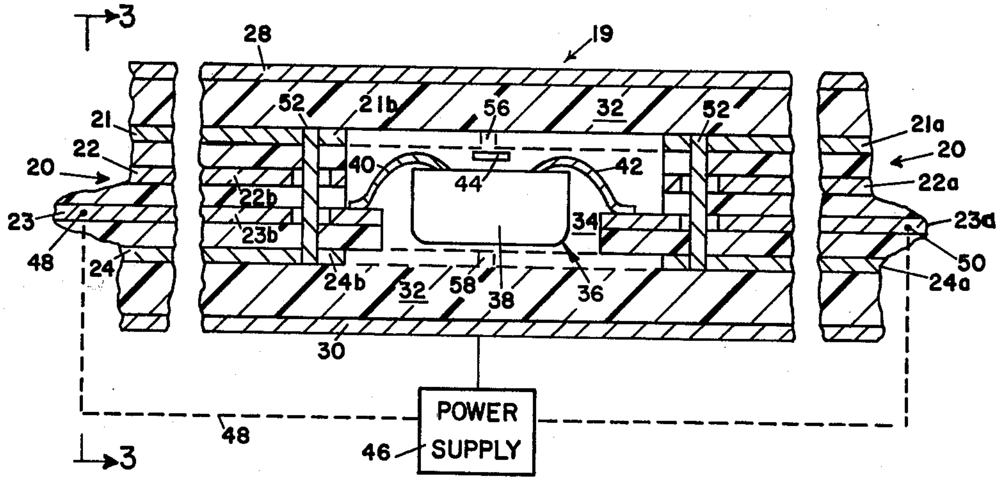
Fig. 2
Lloyd E. St. Jean
*INVENTOR*
Robert O. Richardson
*ATTORNEY*

Lloyd E. St Jean
INVENTOR

Robert O. Richardson
ATTORNEY 3,155,881

HIGH FREQUENCY TRANSMISSION LINE

Lloyd E. St. Jean, Merrick, N.Y., assignor to Sanders Associates Inc., Nashua, N.H., a corporation of Delaware Filed Feb. 28, 1961, Ser. No. 92,260
11 Claims. (Cl. 317—101)

Figure 3:
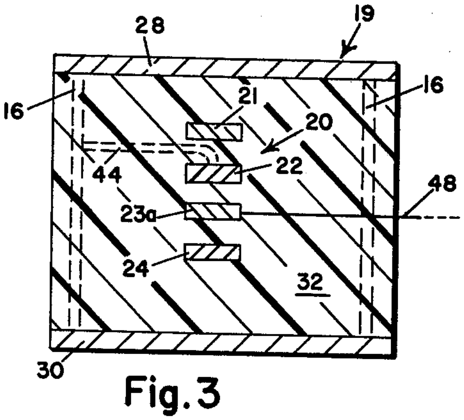

This invention relates to the art of high frequency transmission line assemblies. More particularly, it relates to a strip transmission line having a plurality of conductors disposed between a pair of ground plane outer conductors, and to the use of such transmission lines to package various electronic components in high frequency circuits.

My invention is of particular utility in high frequency circuits using linear or non-linear and passive or active components of all kinds, including, but not limited to, semiconductors, electron tubes, diodes, triodes, tetrodes, pentodes, transistors, thyratrons, voltage controlled rectifiers, trigistors, binistors, thermistors, bolomiters, resistors, capacitors, tunnel diodes, magnistors, parametric amplifiers, masers, and high frequency or microwave components of all kinds. The leads of these components may present considerable reactance to high frequency signals having wavelengths of three hundred centimeters or more. These lead reactances generally adversely affect the transfer of energy between the components and the circuits in which they are connected.

Over a limited frequency range, it is possible to provide impedance matching for these lead reactances. It is expected that advances in the state of the art of all components will provide higher frequency response plus improvements in the physical shape of the connection and terminations to reduce the inductive lead reactance. It is a purpose of this invention to provide high frequency interconnections for components with any form of connection, with the resulting circuit reactance being the minimum imposed by the form of the connections or terminations of the components themselves.

Furthermore, the active components are often controlled, in part, with bias or other low frequency signals. The sources of these control signals must usually be isolated from the high frequency signals operated on by the components.

It is a principal object of my invention to provide an improved electronic assembly in which a controlled circuit component is connected in a high frequency circuit.

Another object of my invention is to provide an improved assembly of the above type capable of efficiently interconnecting a plurality of high frequency circuits having controlled circuit components.

A further object is to provide an assembly of the above type which efficiently conducts control signals to a controlled circuit component connected in a high frequency circuit.

Still another object of my invention is to provide a circuit construction of the above character for efficiently packaging components having a standard housing.

Another object of my invention is to minimize the effects of lead inductances and capacitances normally associated with the use of active components in high frequency circuits.

Another object of my invention is to provide an improved transmission system for guiding two or more high frequency signals isolated from each other.

Another object of my invention is to provide a plurality of high frequency and control circuit interconnections such as are required in a matrix circuit of computer diodes.

Still another object of my invention is to form transmission lines within transmission lines, electrically isolated one from the other.

Other objects of the invention will, in part, be obvious and will, in part, appear hereinafter.

The invention accordingly comprises the features of construction combinations of elements and arrangements of parts which will be exemplified in the constructions hereinafter set forth and the scope of the invention will be indicated in the claims.

In general, an assembly embodying the features of my invention comprises a primary strip transmission line in which a plurality of conductor strips form a composite inner conductor disposed midway between a pair of parallel outer conductors. The conductor strips are isolated from each other at low frequencies but are closely coupled together at the operating frequencies of the line. A controlled circuit component, housed in a gap in the inner conductor, is connected to operate on a high frequency signal on the transmission line signal by means of a series connection between one of the inner conductor strips on each side of the gap. Low frequency and bias voltages and currents applied to other strips connected to the component are efficiently conducted to the component without being coupled to any other conductors in the line.

Furthermore, by shielding one strip between a pair of adjacent strips, I form a second transmission line within the primary line. As shown below, a high frequency signal on the second line is isolated from a similar signal on the primary line.

Figure 4:
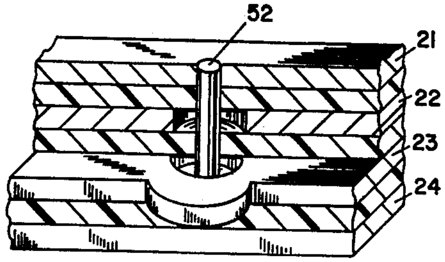
Figure 5:
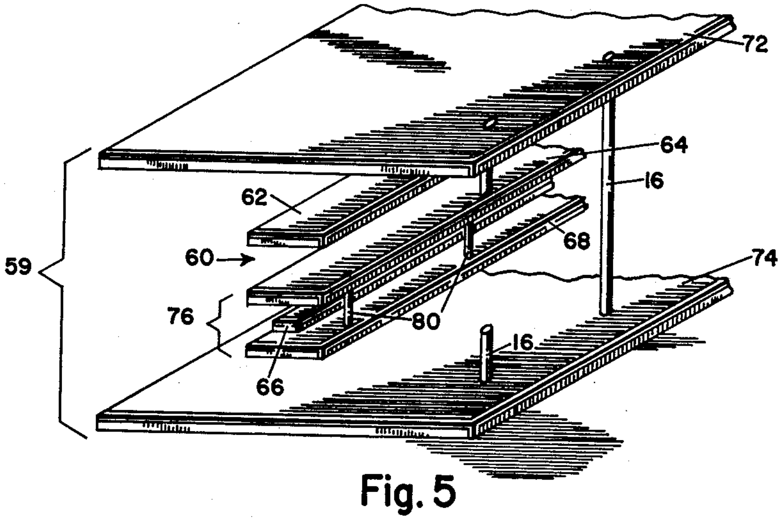

For a fuller understanding of the nature and objects of the invention, reference should be had to the following detailed description taken in connection with the accompanying drawings, in which:

FIGURE 1 is a simplified perspective view of a strip transmission line, having spaced inner conductor strips, showing the configuration of the electric and magnetic field between the conductors, FIGURE 2 is a longitudinal section of a strip transmission line assembly embodying features of my invention, FIGURE 3 is a transverse section of the transmission line assembly of FIGURE 2, taken along line 3—3, FIGURE 4 is a simplified perspective view, partly broken away, of the composite inner conductor of FIGURE 2, FIGURE 5 is a simplified perspective view of another strip transmission line embodying the principles of my invention.

In FIGURE 1 I have illustrated the field distribution in a strip transmission line of the type having spaced-apart inner conducting strips. The line has a composite inner conductor 10, comprising strips 10*a* and 10*b*, situated between and parallel to a pair of outer ground plane conductors 12 and 14. The strips 10*a* and 10*b* and conductors 12 and 14 are flat and may be quite thin. For example, they may be formed of foil bonded to dielectric material (not shown) filling the space between them. At an instant of time when the conductor 10 is positive with respect to the ground plane conductors 12 and 14 and the current in the conductor 10 is in the direction of the arrow 15, the field distribution in the transmission line is as shown in FIGURE 1, with the solid arrows representing the electric field E and the dash lines representing the magnetic field H.

The field configuration of FIGURE 1 is indicative of the transverse electromagnetic propagation mode. However, it is possible to transmit other modes on the line under certain conditions. For example, if the inner conductor 10 is offset from its nominal position midway between the ground plane conductors 12 and 14, the ground planes will be at somewhat different potentials. This difference in voltage will support a parallel plate mode. Accordingly, the ground planes are "shorted" together by a plurality of pins 16 spaced along both edges of the inner conductor. The pins impose as equipotential condition on the ground planes and thereby suppress this mode. For effective suppression, the spacing of the pins in the lengthwise direction of the line should be less than a half wavelength. Ordinarily, this spacing is on the order of one-eighth wavelength or less.

Another limitation on pin spacing results from the desirability of avoiding a resonant condition in any loop defined by the ground planes and a pair of adjacent pins. A resonant loop will distort the transmission characteristics of the line as well as facilitate radiation of energy therefrom. Resonance occurs when the length of the loop is an integral number of wavelengths, and, accordingly, the distance between adjacent pins should be considerably less than the spacing providing a wavelength loop.

If either of the transverse dimensions, i.e., ground plane to ground plane or pin to pin spacing, is greater than a half wavelength, a transverse electrical waveguide mode may be excited. Therefore, both these dimensions should be less than a half wavelength. There is also a restriction on the length of the circumferential path around the inner conductor 10 and passing midway between the inner conductor and the ground plane conductors 12 and 14 and pins 16. This path should be less than a wavelength. Otherwise, the line will support a higher order transverse electric transmission line mode.

As seen in FIGURES 2 and 3, a transmission line generally indicated at 19, incorporating features of my invention, has a composite inner conductor generally indicated at 20, comprising a plurality of conducting strips 21, 22, 23 and 24 disposed between a pair of outer conductors 28 and 30. The conducting strips and outer conductors are separated by an insulating medium indicated at 32. As described above with reference to FIGURE 1, the outer conductors 28 and 30 are connected by shorting pins 16, shown in FIGURE 3. In the drawings, the relative dimensions have been exaggerated for purposes of clarity.

The inner conducting strips 21–24 are preferably in register; the strips 21 and 24 are isolated from the strips 22 and 23 at D.-C. and low frequencies. However, the conducting strips are all closely spaced from each other to maintain the same high frequency potential by means of capacitive coupling between them. Thus, the composite inner conductor 20 appears essentially as a solid conductor to a high frequency signal on the transmission line 19. The transmission line 19 may be fabricated, for example, by bonding the inner conducting strips and the ground plane conductors to thin sheets of dielectric material and then stacking the dielectric sheets in the desired sequence.

Referring to FIGURE 2, a gap 34 in the inner conductor 20 houses a controlled circuit component indicated generally at 36. The portion of inner conductor 20 extending to the right from gap 34 comprises inner conducting strip portions 21*a*–24*a*, and on the left are portions 21*b*–24*b*. By way of example, the component 36 may be a high frequency transistor having a standard housing 38 with a base lead 40 connected to the strip portion 23*b*, a collector lead 42 connected to the portion 23*a* and an emitter lead 44 connected to the ground plane conductors as described below. Assuming that the direction of energy propagation on line 19 (FIGURE 2) is from left to right, a high frequency input signal is applied to the component 36 via the base lead 40, and an output signal continues on the inner conductor 20 by way of the collector lead 42 connected to the strip portion 23*a*.

Bias and power for the transistor 36 are furnished by a power supply 46, connected to develop a base-emitter bias current by way of the portion 23*b* of the conducting strip 23 and a collector-emitter potential by way of the portion 23*a*. The power supply is connected to the emitter of the transistor by means of the ground plane conductors 28 and 30 and the emitter lead 44. Alternatively a printed resistor may be substituted for lead 44 if self bias is desired. In addition, bypass capacitors of the lumped or distributed type may be photo etched on adjacent plates. Thus, the transistor 36 is connected in a common emitter circuit in series with the inner conductor 20. The manner in which the power supply 48 is connected to the conducting strip 23 is described below.

In any transverse section through the line 19, the conductor strips are at the same high frequency potential, but only the strip portions 23*a* and 23*b* are at the respective bias potentials. The other conductor strips are isolated from the power supply voltages. This high frequency apparatus (not shown) such as a signal generator or a receiver can be connected directly to the transmission line by means of the conductor strips 21 and 24 and yet be completely isolated from bias and power or low frequency control signals applied to the conducting strip 23.

As shown in FIGURE 3, the bias connection to the conducting strip portion 23*b* is through a conductor 48 connected to portion 23*b* and extending laterally outward from the inner conductor 20. Conductor 48 extends past the pins 16 into a region essentially free from the high frequency field within the transmission line 19 and connects with the power supply 46 (FIGURE 2). The conductor 48 is preferably of minor thickness and width or of a fine wire, which presents an inductive reactance to the high frequency signal on the transmission line that is substantially greater than the characteristic impedance of the line. A similar conductor 50 (FIGURE 2) connects the conducting strip portion 23*a* to supply 46. Thus, the conductors 48 and 50 have little effect on the properties of the line at the high frequencies propagated therein. Bypass capacitors (not shown) may be photo etched on adjacent plates and connected between each of the conductors 48 and 50 and the shorting pins 16 to further isolate the power supply 46 from the high frequency signals.

The emitter lead 44 is preferably in the form of a flat band that extends laterally outward from the inner conductor 20. As shown in FIGURE 3, the band connects to the ground plane conductors 28 and 30 via a shorting pin 16, thereby providing a low impedance path between the emitter terminal and the ground plane conductors. It is desirable that the length of the lead 44 to the shorting pin be substantially less than a quarter wavelength at the operating frequency. It should be noted that, in a common emitter transistor circuit, there is a 180 degree phase difference between the voltages at the base and the collector. Thus, between the collector and base terminals of the transistor 36 there is a transverse plane of zero voltage. Disposing the lead 44 in this neutral plane will minimize the effect of the lead 44 on the characteristic impedance of the line 19.

High frequency coupling between the conductor strips of inner conductor 20 may be enhanced with coupling pins 52, shown in FIGURES 2 and 4. The coupling pins 52 extend through apertures in the inner conducting strips 22 and 23 and connect to the outer strips 21 and 24. The strips 22 and 23, which are insulated from the coupling pins, are close enough to them for high frequency capacitive coupling therewith; however, they are isolated from the pins at low frequencies.

When a second controlled component (not shown) is incorporated in the transmission line of FIGURE 2, for example, to the right of transistor 36, isolation of a second power supply from component 36 and supply 46 may be required. The second supply can be connected to conducting strip 23 and isolated by forming a gap in the strip 23 intermediate the points where the two power supplies are connected to it. Alternatively, the second power supply may be connected to the strip 22, which is isolated at D.-C. and low frequencies from the transistor 36 and supply 46.

The desired strip line impedance is obtained by controlling the width of the inner conductor 20, its over-all thickness and its spacing from the outer conductors 28 and 30 in a well-known manner.

The component 36 may be shielded from the high frequency fields by extending the outer strips 21 and 24 over the gap 34, as indicated with dotted lines in FIGURE 2. A smaller gap 56 will then separate the portions 21*a* and 21*b* of the strip 21, and a gap 58 will separate the portions 24*a* and 24*b*.

FIGURE 5 illustrates another embodiment of my invention in which the inner conductor strips are arranged to guide a second high frequency signal independently of the signal propagated along the transmission line using the outer ground plane conductors. A transmission line generally indicated at 59 has a center conductor generally indicated at 60, disposed between a pair of ground plane conductors 72 and 74. Inner conductor 60 comprises conductor strips 62, 64, 66 and 68. The construction of the transmission line 59 is generally similar to that shown and described in FIGURES 2 and 3, except that the conducting strip 66 and the strips 64 and 68 on opposite sides thereof form a second strip transmission line generally indicated at 76. More specifically, strips 64 and 68 are the "ground plane" conductors of the line 76, and strip 66 is the inner conductor. The strips 64 and 68 may be shorted together with shorting pins 80 similar to the pins 16 of FIGURE 1.

The shorting pins 80 prevent the high frequency energy on the line 76 from fringing beyond the strips 64 and 68. Accordingly, a signal carried by the transmission line 59 is isolated from a second signal carried by the line 76.

The novel arrangement of the transmission lines 59 and 76 may, for example, be used to advantage in a mixer circuit in which a high frequency input signal and a local oscillator signal are applied to a non-linear element such as a crystal diode or a transistor. The non-linear element, which develops output signals whose frequencies are equal to sum and difference of its input frequencies, may be housed in a gap in the inner conductor 60, similar to gap 34 of FIGURE 2. The input signal may be conducted to the element on line 59 and the local oscillator signal on line 76. The output signal is preferably guided on a continuation of line 59 extending from the gap. Thus, the signals to be mixed are efficiently guided to the mixer element with a compact structure.

Thus, I have described an improved strip transmission line having three or more inner conductors stacked between a pair of outer or ground plane conductors. A controlled circuit component can be efficiently packaged in the line and connected to a high frequency signal on it with a minimum of lead reactance. Furthermore, bias, power supply or low frequency currents and voltages, from external circuits, can be conducted to the component along the inner conductors with little leakage of high frequency energy from the transmission line. The low frequency and direct current signals are conducted on inner conductors maintained at the same high frequency potential by capacitive coupling, but isolated from each other at the low frequencies.

I have also described a strip transmission line construction in which the inner conductors themselves form a second transmission line capable of conducting a second high frequency signal independent from the signal on the main transmission line. This construction further facilitates the use of controlled circuit components in high frequency circuits.

It will thus be seen that the objects set forth above, among those made apparent from the preceding description, are efficiently attained and, since certain changes may be made in the above constructions without departing from the scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

What is claimed is:

1. A high frequency strip transmission line comprising, in combination, a pair of parallel planar outer conductors extending along a longitudinal axis, at least three superimposed inner conductor strips disposed between said outer conductors and extending substantially parallel to said longitudinal axis, insulating means spacing said strips closely apart, whereby said strips are isolated from each other at low frequencies and closely coupled together at the operating frequency of said line.

2. The combination defined in claim 1 including a conducting member disposed between and parallel to two adjacent conductor strips, said member being substantially narrower than said adjacent strips.

3. The combination defined in claim 1 including a conductor perpendicular to and closely spaced from said conductor strips to enhance capacitive coupling between them.

4. A high frequency strip transmission line comprising, in combination, a pair of ground plane outer conductors, at least three conductor strips disposed between said outer conductors, an insulator spacing said strips closely apart, whereby said strips are isolated from each other at low frequencies and closely coupled together at the operating frequency of said line, and means forming a gap interrupting said strips, a circuit component disposed in said gap, and means connecting said component to portions of said strips on opposite sides of said gap.

5. A high frequency transmission line assembly comprising, in combination, a strip transmission line having an inner conductor and ground plane conductors disposed on opposite sides of said inner conductor, said inner conductor comprising at least three conductor strips, said strips being closely spaced apart in register with each other, whereby they are isolated from each other at low frequencies and closely coupled together at the operating frequency of said line, means forming a gap in said inner conductor, a circuit component disposed in said gap, said component having an electrically controllable characteristic, said component being connected to portions of said strips on opposite sides of said gap, the fields in said line in the vicinity of said element being dependent on said characteristic, and means for controlling said characteristic.

6. The combination defined in claim 5 in which said controlling means is connected to the same strip portions as said component.

7. The combination defined in claim 5 in which the width of said gap in the outer strips of said inner conductor is substantially less than the width of said gap in the remainder of said strips.

8. A high frequency transmission line assembly comprising, in combination, a strip transmission line having an inner conductor disposed between a pair of planar outer conductors, said inner conductor comprising at least three parallel conductor strips closely spaced apart and in register with each other thereby being isolated from each other at low frequencies and closely coupled to have substantially the same potential at the high operating frequency of said line, means forming a gap in said inner conductor interrupting each of said strips, a circuit component disposed in said gap, said component having an electrically controllable characteristic, a first lead of said component connected to a first strip portion, a second lead of said component connected to said second strip portion extending from the side of said gap opposite from said first strip portion, means external to said transmission line for electrically controlling said characteristic, and relatively fine conductors extending transversely from said first and second strip portions and connecting said controlling means to them.

9. The combination defined in claim 8 including conducting means spaced transversely from said conductor strips on both sides thereof and connecting said outer conductors together to maintain them at substantially the same potential, and in which said component is a transistor having a third lead extending therefrom transversely to said inner conductor and connecting to one of said outer conductors.

10. The combination defined in claim 8 in which two of said strip portions extend into said gap from each side thereof to shield said component from the fields in said transmission line.

11. A transmission line comprising, in combination, a first strip transmission line having a pair of planar outer conductors and an inner conductor disposed between said outer conductors, said inner conductor comprising a plurality of conductor strips closely spaced apart in register with each other, a conducting member disposed between two adjacent strips, said conducting member being substantially narrower than said adjacent strips thereby to form the inner conductor of a second strip transmission line with said two adjacent strips being the ground plane conductors thereof, and conductors spaced transversely from said conducting member on both sides thereof and connecting said two adjacent strips to maintain them at substantially the same potential.

References Cited in the file of this patent

UNITED STATES PATENTS

| | | |
|---|---|---|
| 1,854,255 | Green | Apr. 19, 1932 |
| 2,860,308 | Bales | Nov. 11, 1958 |
| 3,015,081 | Ayer et al. | Dec. 26, 1961 |

OTHER REFERENCES

Barrett, R. M.: Etched Sheets Serve as Microwave Components, Electronics, June 1952, pages 114–118.